United States Patent

Ogawa

Patent Number: 5,254,864
Date of Patent: Oct. 19, 1993

[54] SEMICONDUCTOR DEVICE

[75] Inventor: Tetsuo Ogawa, Kanagawa, Japan

[73] Assignee: Sony Corporation, Tokyo, Japan

[21] Appl. No.: 855,093

[22] Filed: Mar. 20, 1992

[30] Foreign Application Priority Data

Mar. 20, 1991 [JP] Japan .................... 3-081410

[51] Int. Cl.$^5$ .................. H01L 27/02; H01L 21/265
[52] U.S. Cl. ........................ 257/273; 257/260;
257/281; 257/519; 257/549; 437/31; 437/40;
437/63; 437/154; 437/175; 437/911
[58] Field of Search ............... 357/22, 43; 437/31,
437/40, 63, 154, 175, 911; 257/260, 273, 281,
519, 549

[56] References Cited

U.S. PATENT DOCUMENTS 5,068,756  11/1991  Morris et al. ................. 357/43

Primary Examiner—Edward Wojciechowicz
Attorney, Agent, or Firm—Hill, Steadman & Simpson

[57] ABSTRACT

A semiconductor device wherein a bipolar transistor and a junction type field effect transistor which has a high voltage resisting property and a high mutual conductance are formed into a single chip to reduce the cost. A bipolar transistor formation region is separated from a junction type field effect transistor formation region by a transistor separating region. In the former region, a collector diffused layer is formed on the semiconductor substrate on which an epitaxial layer is formed, and a base diffused layer and a collector lead diffused layer are formed in the epitaxial layer with an element separating region interposed therebetween and connect to the collector diffused layer. Further, an emitter diffused layer is formed on the base diffused layer. In the latter region, a bottom gate diffused layer is formed on the semiconductor substrate, and a channel formation region is formed in the epitaxial layer and connects to the bottom gate diffused layer. A top gate electrode is formed on the channel formation region and a pair of source/drain diffused layers are formed on the opposite sides of the top gate diffused layer and so forth.

3 Claims, 6 Drawing Sheets

SEMICONDUCTOR DEVICE

BACKGROUND OF THE INVENTION

1. Field of the Invention

This invention relates to a semiconductor device wherein a bipolar transistor and a junction type field effect transistor are formed on a common substrate.

2. Description of the Prior Art

A bipolar transistor for signal processing results in a a high speed operation in order to obtain a lower power consumption and a high frequency for a system which employs the bipolar transistor.

In particular, a pattern of a bipolar transistor is made finer to reduce the parasitic capacity of the bipolar transistor to realize operation with a low current while an epitaxial layer is formed in a thin film to allow a high frequency. Such bipolar transistors for signal processing highly are integrated into a single chip device.

A high voltage resisting external element of the high voltage driven type is known. For example, a high voltage resisting transistor for use with a variable capacitance diode of a tuner or the like is, when it is to be used in order to prevent possible deterioration in the characteristics of the tuner and together with a bipolar transistor for signal processing, externally connected to the bipolar transistor for signal processing.

However, when both a high voltage resisting transistor and a bipolar transistor for signal processing are to be used, if the high voltage resisting transistor is externally connected to the bipolar transistor for signal processing, then reduction in the number of externally connected parts is not achieved. Further, a great number of parts are required, and a step for externally connecting the high voltage resistance transistor to the bipolar transistor for signal processing is required, which results in high production costs.

SUMMARY OF THE INVENTION

It is an object of the present invention to provide a semiconductor device wherein a bipolar transistor and a junction type field effect transistor which has a high voltage resisting property and a high mutual conductance are formed on a common substrate.

In order to attain the object, according to the present invention, there is provided a semiconductor device including a bipolar transistor and a junction type field effect transistor, which comprises a semiconductor substrate, an epitaxial layer formed on an upper face of the semiconductor substrate, a transistor separating region formed in the epitaxial layer except over a formation region for the bipolar transistor and another formation region for the junction type field effect transistor, a collector diffused layer formed in an upper face portion of the semiconductor substrate in the formation region for the bipolar transistor, a base diffused layer formed in the epitaxial layer in the formation region for the bipolar transistor in such a manner as to connect to the collector diffused layer, an emitter diffused layer formed as part of an upper face portion of the base diffused layer, an element separating region formed in the epitaxial layer in the formation region for the bipolar transistor in such a manner as to border the base diffused layer, a collector lead diffused layer formed in the epitaxial layer in the formation region for the bipolar transistor on the opposite side of the base diffused layer with respect to the element separating region in such a manner as to connect to the collector diffused layer, a bottom gate diffused layer formed in an upper face portion of the semiconductor substrate in the formation region for the junction type field effect transistor, a channel formation region formed in the epitaxial layer in the formation region for the junction type field effect transistor in such a manner as to connect to the bottom gate diffused layer, a top gate diffused layer formed in the epitaxial layer in the formation region for the junction type field effect transistor in such a manner as to connect to the channel formation region, and a pair of source/drain diffused layers formed in the epitaxial layer on the opposite sides of the channel formation region in the formation region for the junction type field effect transistor.

With the semiconductor device, since the bipolar transistor has a vertical bipolar transistor structure, it operates at a high speed at a high frequency. Meanwhile, since the junction type field effect transistor is formed such that the bottom gate diffused layer, channel forming region and top gate diffused layer are connected to each other and the source/drain diffused layers are formed on the opposite sides of the channel forming region, it has a high voltage resisting property and a high mutual conductance.

Further, such junction type field effect transistor can be formed by a manufacturing process for a bipolar transistor by forming the bottom gate diffused layer of the junction type field effect transistor as an upper layer on the semiconductor substrate and forming the channel formation region as a lower of the epitaxial layer in such a manner as to connect to the bottom gate diffused layer. Consequently, the bipolar transistor and the junction type field effect transistor can be formed in a chip.

Accordingly, it is not necessary to externally connect a junction type field effect transistor having a high voltage resisting property and a high mutual conductance to the bipolar transistor. Consequently, reduction in the number of parts for the external connection can be achieved and the production costs for such external connection can be reduced.

The above and other objects, features and advantages of the present invention will become apparent from the following description and the appended claims, taken in conjunction with the accompanying drawings in which like parts or elements are denoted by like reference characters.

DETAILED DESCRIPTION OF THE PREFERRED EMBODIMENT

Figure 1:
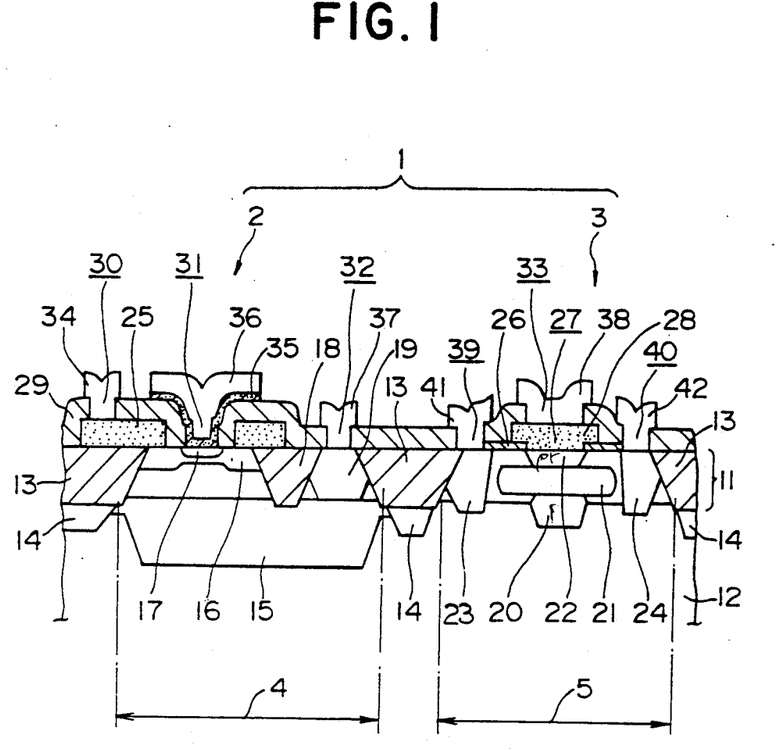
FIG. 1 is a schematic sectional view of a semiconductor device showing a preferred embodiment of the present invention.

Referring first to FIG. 1, there is shown a semiconductor device to which the present invention is applied. The semiconductor device generally denoted at 1 is generally constructed such that an npn bipolar transistor 2 for signal processing and an n-channel junction type field effect transistor 3 which has a high voltage resisting property and a high mutual conductance are formed using a common semiconductor substrate 12 made of p-type silicon monocrystal and provided on an upper face of an epitaxial layer 11 of n-type silicon monocrystal.

In particular, a transistor separating region 13 is formed at a portion of the epitaxial layer 11 except a formation region 4 for an npn bipolar transistor generally indicated by a range of a double-sided arrow 4 and another formation region 5 for a junction type field effect transistor 5 generally indicated by a range of another double-sided arrow 5. The transistor separating region 13 is formed, for example, from a silicon oxide film, for example, by the LOCOS method. Further, a p+ channel stopper region 14 is formed as an upper layer on the semiconductor substrate 12 in such a manner as to connect to the transistor separating region 13.

An n+ collector diffused layer 15 in the form of an n+ buried diffused layer is formed as an upper layer on the semiconductor substrate 12 in the npn bipolar transistor formation region 4. As an upper layer on the epitaxial layer 11, a p+ base diffused layer 16 is formed in such a manner as to connect to the n+ collector diffused layer 15 by way of a lower layer portion of the epitaxial diffused layer 11. An n+ emitter diffused layer 17 is formed at part of the p+ base diffused layer 16. An element dividing region 18 is formed on the epitaxial layer 11 in such a manner as to neighbor with the p+ base diffused layer 16. On the epitaxial layer 11 on the opposite side of the p+ base diffused layer 16 with respect to the element separating region 18, an n+ connector lead diffused layer 19 is formed in such a manner as to connect to the n+ collector diffused layer 15. The npn bipolar transistor 2 is formed in such a manner as described just above.

A p-type bottom date diffused layer 20 is formed as an upper layer of the semiconductor substrate 12 in the n-channel junction type field effect transistor formation region 5. An n+ channel formation region 21 is formed as a lower layer of the epitaxial layer 11 in such a manner as to connect to the bottom gate diffused layer 20. A p+ top gate diffused layer 22 is formed in the epitaxial layer 11 in such a manner as to connect to the n+ channel formation region 21. A pair of n+ source/drain diffused layers 23 and 24 are formed in the epitaxial layer 11 on the opposite sides of the channel formation region 21. The n-channel junction type field effect transistor 3 is formed in such a manner as described just above.

Further, a p+ base lead electrode 25 made of, for example, a polycrystalline silicon film containing a p-type impurity therein is formed on an upper face of the epitaxial layer 11 in such a manner as to connect to the p+ base diffused layer 16. A thin insulating film 26 made of, for example, a silicon oxide film is formed as an upper layer on the epitaxial layer 11 in the n-channel junction type field effect transistor formation region 5. A contact hole 27 is formed in the thin insulating film 26 above the p+ top gate diffused layer 22. A p+ gate lead electrode 28 made of, for example, a polycrystalline silicon layer containing a p-type impurity therein is formed on an upper face of the thin insulating film 26 in such a manner as to connect to the p+ top gate diffused layer 22 through the contact hole 27.

An interlayer insulating film 29 made of, for example, a silicon oxide film is formed on an entire area of the p+ base lead electrode 25 and the p+ gate lead electrode 28.

The interlayer insulating film 29 has contact holes 30, 31, 32 and 33 formed therein above the p+ base lead electrode 25, n+ emitter diffused layer 17, n+ collector lead diffused layer 19 and p+ gate lead electrode 28, respectively.

A base electrode 34 is formed on an upper face of the interlayer insulating film 29 in such manner as to connect to the p+ base lead electrode 25 through the contact hole 30. An n+ emitter lead electrode 35 is formed on the upper face of the interlayer insulating film 29 in such a manner as to connect to the n+ emitter diffused layer 17 through the contact hole 31. The n+ emitter lead electrode 35 is made of, for example, a polycrystalline silicon layer containing an n-type impurity therein.

An emitter electrode 36 is formed on the upper face of the n+ emitter lead electrode 35. A collector electrode 37 is formed on the upper face of the interlayer insulating film 29 in such a manner as to connect to the n+ lead diffused layer 19 through the contact hole 32. A gate electrode 38 is formed on the upper face of the interlayer insulating film 29 in such a manner as to connect to the p+ gate lead electrode 28 through the contact hole 33.

Contact holes 39 and 40 are formed in the inter layer insulating film 29 and the thin insulating film 26 above the n+ source/drain diffused layers 23 and 24, respectively. Meanwhile, a pair of source/drain electrodes 41 and 42 are formed on the upper face of the interlayer insulating film 29 in such a manner as to connect to the n+ source/drain diffused layers 23 and 24 through the contact holes 39 and 40, respectively.

The npn bipolar transistor 2 of the semiconductor device 1 formed in such a manner as described above performs a high speed operation at a high frequency while the n-channel junction type field effect transistor 3 is capable of resisting high voltage inputs and operates with a high mutual conductance.

While the semiconductor device 1 wherein the npn bipolar transistor 2 and the n-channel junction type field effect transistor 3 are formed is described in the embodiment, it is also possible to form the semiconductor device 1 from a pnp bipolar transistor and a p-channel junction type field effect transistor. In this instance, an n+ well diffused layer is formed between a p+ collector diffused layer of the pnp bipolar transistor and a p-type semiconductor substrate and another n+ well diffused layer is formed between a bottom gate diffused layer of the p-channel junction type field effect transistor and the p-type semiconductor substrate. Other component elements are formed such that the p-type elements are replaced by n-type elements while the n-type elements are replaced by p-type elements.

A process of manufacturing the semiconductor device 1 described above will be described subsequently with reference to FIGS. 2 to 11.

Figure 2:
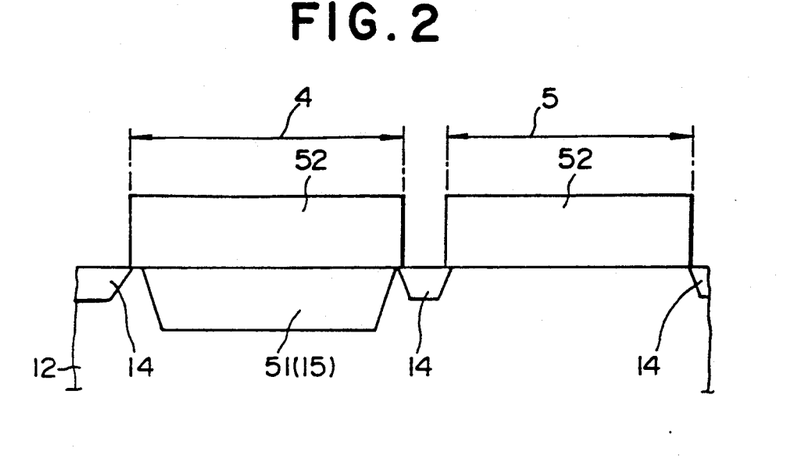
FIGS. 2 to 15 are schematic views illustrating successive steps in manufacturing the semiconductor device.

First, resist is applied to an upper face of a semiconductor substrate 12 made of p-type monocrystal silicon to form a resist film as shown in FIG. 2, and then the resist film is exposed to light and developed to form an ion implantation mask (not shown). Then, using the ion implantation mask, ions of an n-type impurity are implanted into an upper face portion of the semiconductor substrate 12 to form an n+ buried diffused layer 51. The n+ buried diffused layer 51 will later make a collector diffused layer (15). After then, the ion implantation mask is removed by ashing processing or the like.

Subsequently, an ion implantation mask 52 is formed from resist on an upper face of the semiconductor substrate 12 in a similar manner as described above. Then, using the ion implantation mask 52, ions of a p-type impurity are implanted into an upper face portion of the semiconductor substrate 12 to form a p+ channel stopper region 14 for separating an npn bipolar transistor formation region 4 and an n-channel junction type field effect transistor formation region 5 from each other.

After that, the ion implantation mask 52 is removed by ashing processing or the like.

Figure 3:
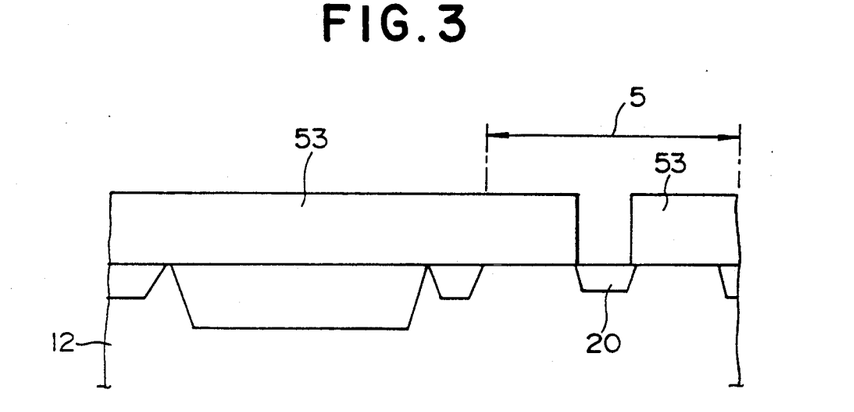

Subsequently, a different ion implantation mask 53 is formed from resist on the upper face of the semiconductor substrate 12 in a similar manner as described above. Then, using the ion implantation mask 53, ions of a p-type impurity are implanted into an upper face portion of the semiconductor substrate 12 in part of an n-channel junction type field effect transistor formation region 5 generally indicated by a range of a double-sided arrow mark 5 to form a bottom gate diffused layer 20.

After that, the ion implantation mask 53 is removed by ashing processing or the like.

Figure 4:
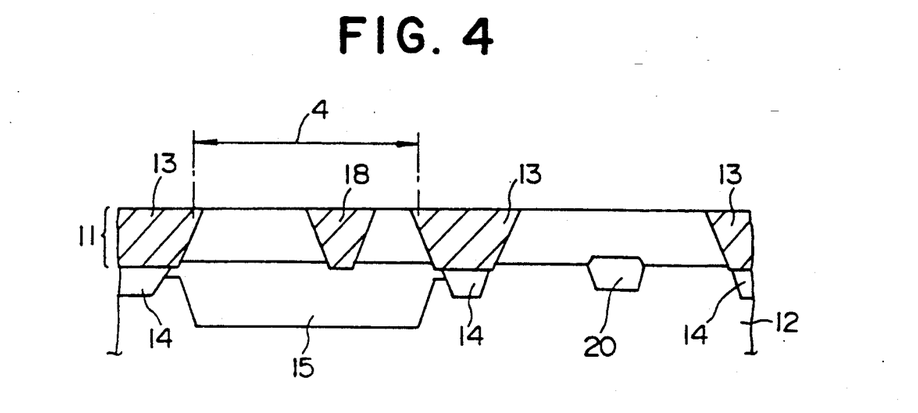

Then, an n-type epitaxial layer 11 is formed on the entire upper face of the semiconductor substrate 12 by an ordinary epitaxial growth method as shown in FIG. 4. Then, a transistor separating region 13 is formed by an ordinary LOCOS method in such a condition that it extends through the epitaxial layer 11 to the p+ channel stopper region 14. Simultaneously, an element separating region 18 is formed at part of the epitaxial layer 11 of the bipolar transistor forming region 4 such that it extends through the epitaxial layer 11 to the n+ collector diffused layer 15. Thereupon, the bottom gate diffused layer 20 is diffused to a lower face portion of the epitaxial layer 11.

Figure 5:
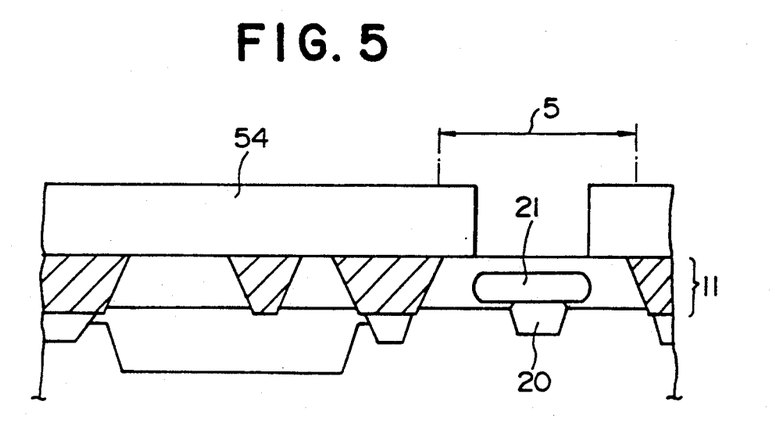

Subsequently, an ion implantation mask 54 is formed from resist on an upper face of the epitaxial layer 11 as shown in FIG. 5 in a similar manner as described above. Then, using the ion implantation mask 54, ions of an n-type impurity are implanted into the epitaxial layer 11 in the n-channel junction type field effect transistor formation region 5 to form an n+ channel formation region 21 in such a manner as to connect to the bottom gate diffused layer 20 in the epitaxial layer 11.

After that, the ion implantation mask 54 is removed by ashing processing or the like.

Figure 6:
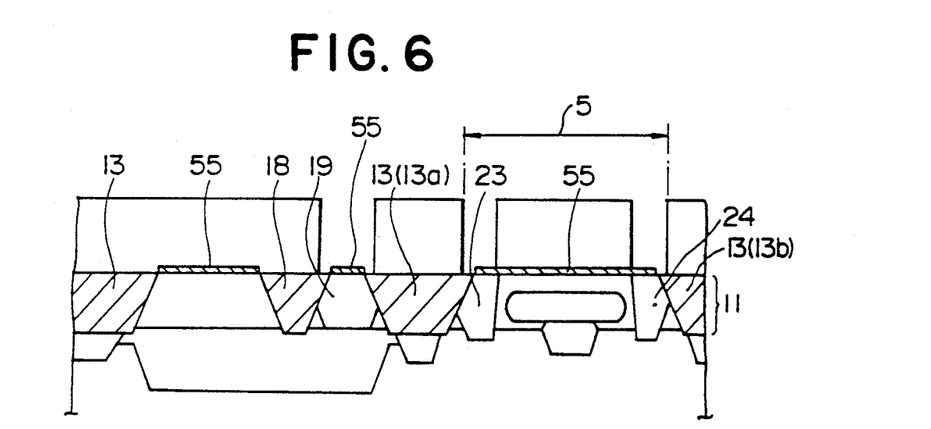

Then, a silicon oxide film 55 is formed on the upper face of the epitaxial layer 11 except the transistor separating region 13 and the element separating region 18 as shown in FIG. 6 using a thermal oxidation method or the like. After that, an ion implantation mask 56 is formed on the silicon oxide film 55 in a similar manner as described above, and then ions of an n-type impurity are implanted into the epitaxial layer 11 between the transistor separating region 13 (13a) and the element separating region (18) and into the transistor separating regions 13a and 13 (13b) in the n-channel junction type field effect transistor formation region 5 to form an n+ collector lead diffused layer 19 and a pair of source/drain diffused layers 23 and 24, respectively.

Then, the ion implantation mask 56 is removed by ashing processing or the like.

Figure 7:
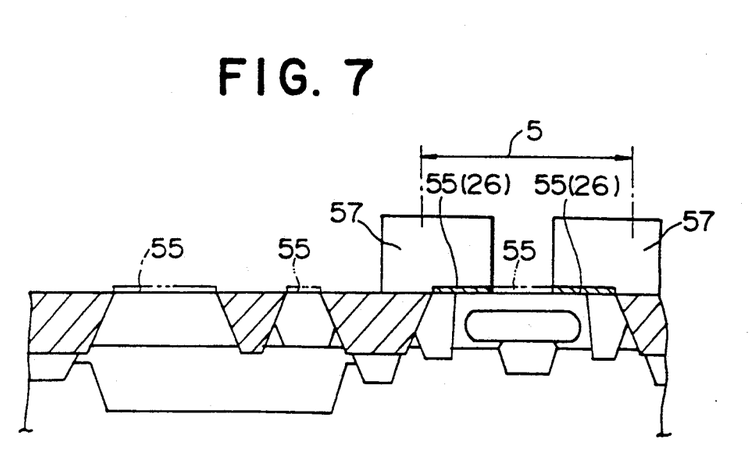

After that, a resist film is formed on an entire face of the silicon oxide film 55 and is exposed to light and developed to form an etching mask 57 in such a manner as to cover over the n-channel junction type field effect transistor formation region 5 except a region in which an n+ top gate diffused layer (22) which will be hereinafter described is to be formed, as shown in FIG. 7. Then, portions of the silicon oxide film 55 indicated by an alternate long and two short dashes line which are exposed outside through the etching mask 57 are removed by etching so that a thin insulating film (26) may be formed by the silicon oxide film 55 which remains after such etching.

After that, the etching mask 57 is removed by ashing processing or the like.

Figure 8:
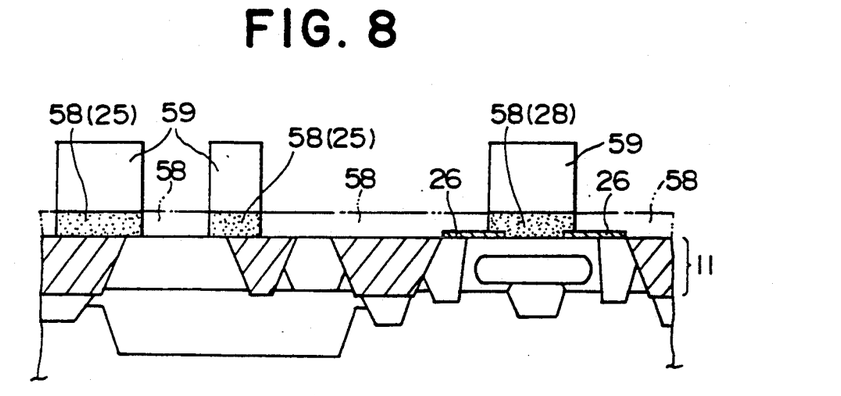

Then, a first polycrystalline silicon film 58 is formed on the upper face of the epitaxial layer 11 including an upper face of the thin insulating film 26 as shown in FIG. 8. After that, ions of a p-type impurity are implanted into the first polycrystalline silicon film 58 by an ion implantation method. Subsequently, an etching mask 59 made of a resist film is formed on an upper face of the first polycrystalline silicon film 58 in a similar manner as described hereinabove with reference to FIG. 7. Then, etching is performed using the etching mask 59 so that a p+ base lead electrode (25) and a p+ gate lead electrode (28) may be formed from the first polycrystalline silicon film 58 which remains after such etching.

Then, the etching mask 59 is removed by ashing processing or the like.

Figure 9:
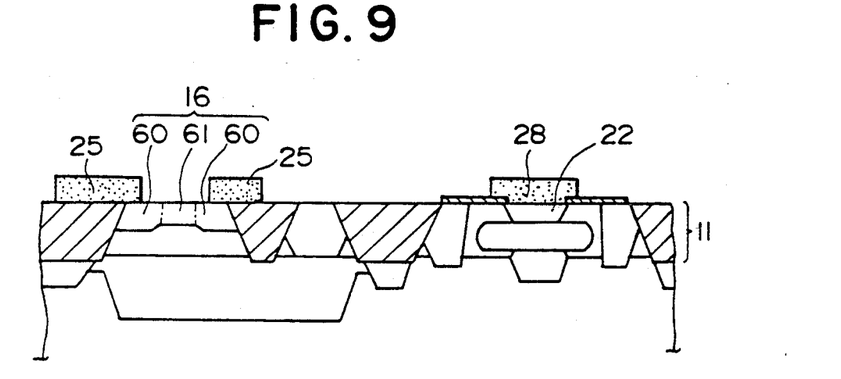

Subsequently, thermal diffusing processing is performed so as to diffuse the p-type impurity contained in the p+ base lead electrode 25 into an upper face portion of the epitaxial layer 11 to form a p+ graft base region 60 as shown in FIG. 9. Further, the p-type impurity contained in the p+ gate lead electrode 28 is diffused into an upper face portion of the epitaxial layer 11 to form a p+ top gate diffused layer 22. After that, an ion implantation mask (not shown) having an opening is formed on a formation area for a p+ base diffused layer 16 by a photo-lithography technique. Then, ions of a p-type impurity are implanted into an upper face portion of the epitaxial layer 11 through the opening of the ion implantation mask to form an intrinsic base region 61. The intrinsic base region 61 and the graft base region 60 will later make a p+ base diffused layer 16. After that, the ion implantation mask is removed by ashing processing or the like.

Figure 10:
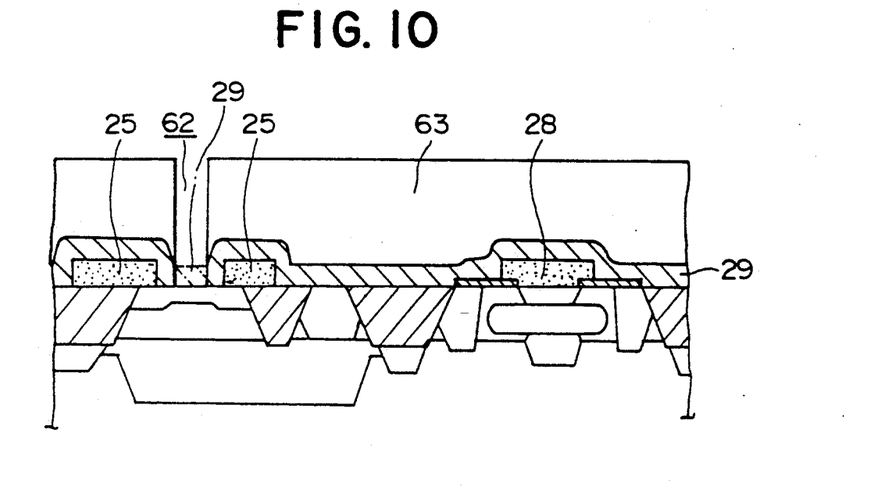

Subsequently, an interlayer insulating film 29 made of a silicon oxide film is formed over an entire area including the p+ base lead electrode 25 and the p+ gate lead electrode 28 as shown in FIG. 10 by a chemical vapor phase growth method.

Then, an etching mask 63 made of a resist and having an opening 62 above a formation region for an n+ emitter diffused layer is formed. Then, etching is performed to remove a portion of the interlayer insulating film 29 indicated by an alternate long and two short dashes line which is exposed to the outside through the opening 62 to form a contact hole 31.

After that, the etching mask 63 is removed by ashing processing or the like.

Figure 11:
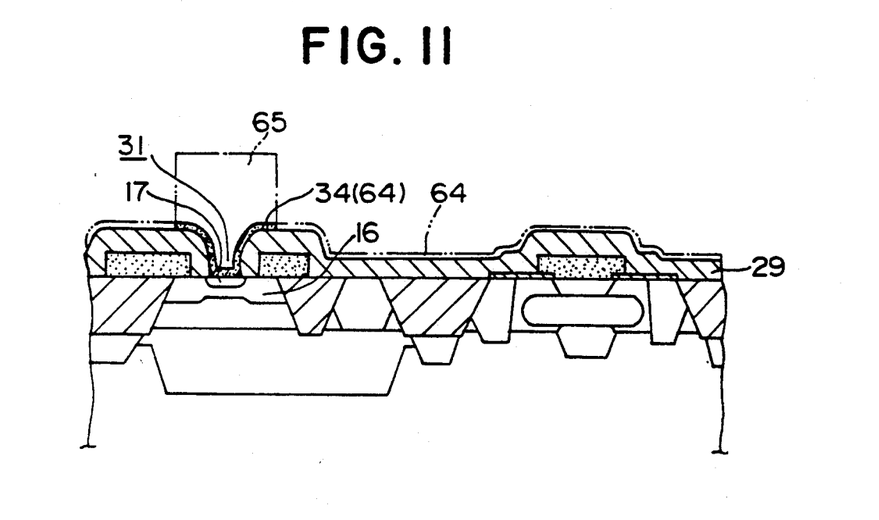

Then, a polycrystalline silicon film 64 is formed on the interlayer insulating film 29 including the contact hole 31 as shown in FIG. 11 by a chemical vapor phase growth method, and ions of an n-type impurity (for example, arsenic [As]) are implanted into the polycrystalline silicon film 64 by an ion implantation method. Subsequently, an etching mask 65 (alternate long and short dash line portion) made of a resist film is formed on an upper face of the polycrystalline film 64 in a formation region for an n+ emitter lead electrode 34. After that, etching is performed to remove the polycrystalline silicon film 64 at a portion indicated by an alternate long and two short dashes line so that an n+ emitter lead electrode 34 may be formed from the polycrystalline silicon film 64 which remains after such etching. Then, the etching mask 65 is removed by ashing processing or the like.

After that, thermal diffusing processing is performed to diffuse the n-type impurity (arsenic) contained in the n+ etching lead electrode 34 into an upper face portion of the p+ base diffused layer 16 to form an n+ emitter diffused layer 17.

Figure 12:
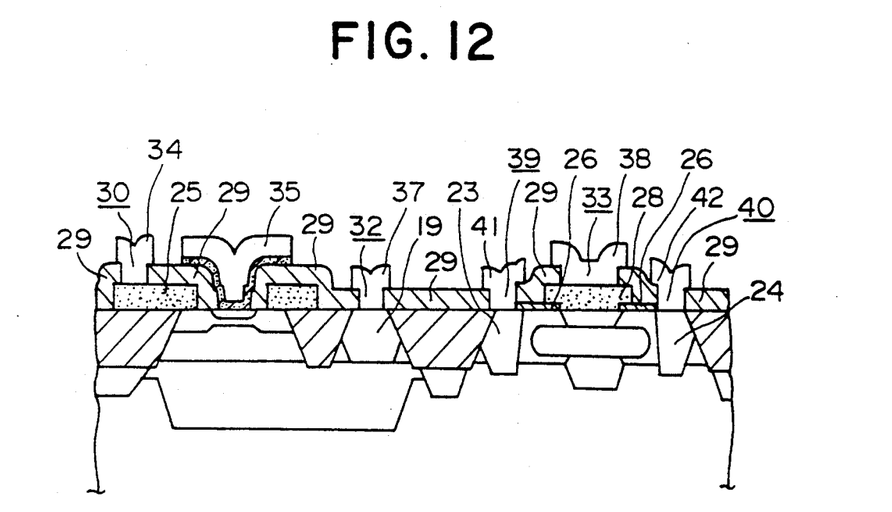

Subsequently, contact holes 30, 32, 33, 39 and 40 are formed in the interlayer insulating film 29 above the p+ base lead electrode 25, n+ collector lead diffused layer 19, p+gate lead electrode 28 and n+ source/drain diffused layers 23 and 24, respectively, as shown in FIG. 12 by a photo-lithography technique and etching. In this instance, the contact holes 39 and 40 are formed in a condition wherein they extend through the thin insulating film 26. Subsequently, for example, an aluminum allow film is formed on an entire face including the interlayer insulating film 29, and after that, a base electrode 34, an emitter electrode 35, a collector electrode 37, a gate electrode 38 and a pair of source/drain electrodes 41 and 42 are formed from the aluminum alloy film by a photo-lithography technique and etching.

It is to be noted that, after removal of each ion implantation mask described hereinabove with reference to FIGS. 2 to 9, normally an impurity which has been used to implant of ions is diffused and heat treatment is performed to eliminate possible crystal defects which may otherwise occur at any portion into which ions have been implanted.

According to the manufacturing process described above, a bottom gate diffused layer 20 and an n+ channel diffused layer region 21 are formed at the ion implantation steps described hereinabove with reference to FIGS. 2 to 5, and a p+ to gate diffused layer 22 is formed upon formation of a p+ graft base region 60 and a pair of n+ source/drain diffused layers 23 and 24 are formed upon formation of an n+ collector lead diffused layer 19. Consequently, an npn bipolar transistor 2 and an n-channel junction type field effect transistor 3 which has a high voltage resisting property and a high mutual conductance are formed on a common semiconductor substrate 12 only by adding such ion implanting steps described hereinabove with reference to FIGS. 2 to 5 to a manufacturing process for an npn bipolar transistor.

Subsequently, a modified manufacturing process wherein a bottom gate diffused layer 20 is formed with more uniform thickness to further enhance the electric characteristics such as a mutual conductance of an n-channel junction type field effect transistor 3 than by the manufacturing process described above will be described with reference to FIGS. 13 to 15.

Figure 13:
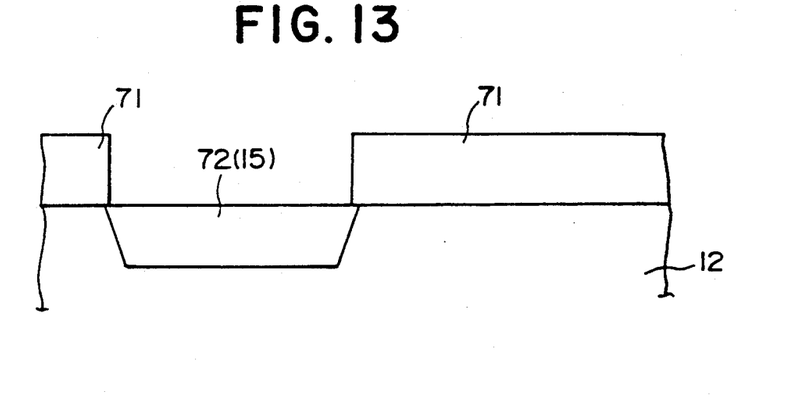

First, an ion implantation mask 71 made of a resist is formed on an upper face of a semiconductor substrate 12 made of p-type monocrystal silicon as shown in FIG. 13. Using the ion implantation mask 71, ions of an n-type impurity are implanted into an upper face portion of the semiconductor substrate 12 to form an n+ buried diffused layer 72 (n+ collector region 15).

After that, the ion implantation mask 71 is removed by ashing processing or the like.

Figure 14:
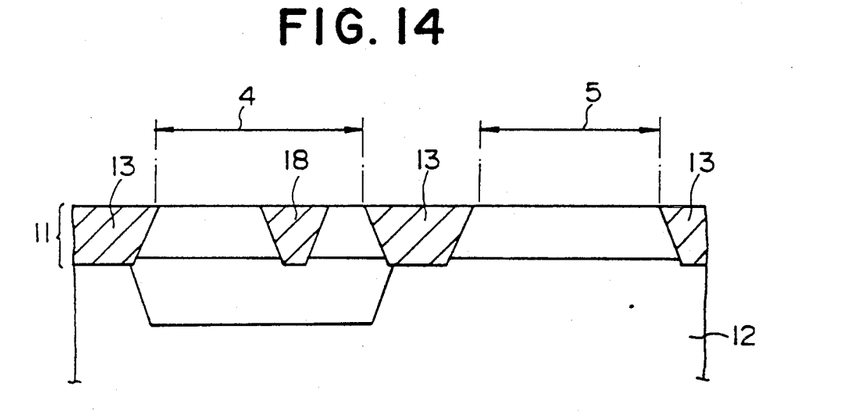

Then, an n-type epitaxial layer 11 is formed on the upper face of the semiconductor substrate 12 as shown in FIG. 14 by an epitaxial growth method. Subsequently, a transistor separating region 13 for separating a formation region 4 for an npn bipolar transistor indicated by a double-sided arrow 4 and another formation region 5 for an n-channel junction type field effect transistor 5 indicated by another double-sided arrow 5 is formed by a LOCOS method. Simultaneously, an element separating region 18 for separating an n+ collector lead diffused region and a p+ base diffused layer which will be hereinafter described from each other is formed at part of the epitaxial layer 11 in the npn bipolar transistor formation region 4.

Figure 15:
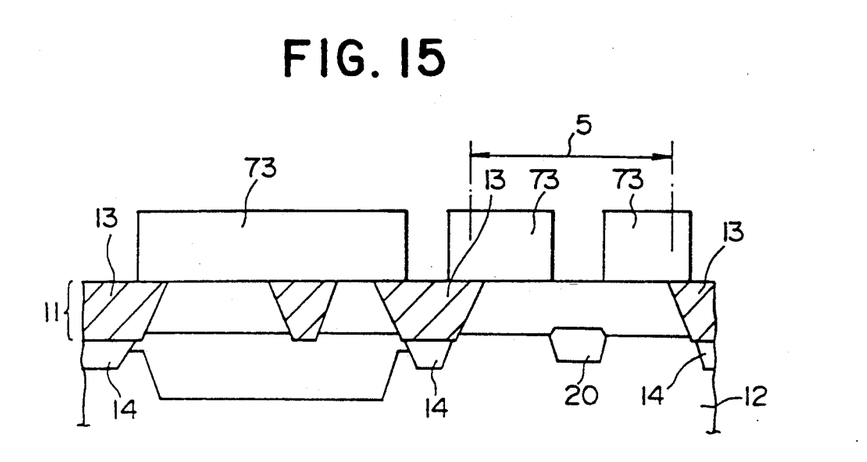

Subsequently, an ion implantation mask 73 made of, for example, a resist is formed on the upper face of the epitaxial layer as shown in FIG. 15. Then, using the ion implantation mask 73, ions of a p-type impurity are implanted into an upper face portion of the semiconductor substrate 12 to form a bottom gate diffused layer 20 in an upper face portion of the semiconductor substrate 12 and a lower face portion of the epitaxial layer 11 in the n-channel junction type field effect transistor formation region 5 and simultaneously form a p+ channel stopper region 14 in an upper face portion of the semiconductor substrate 12 in such a manner to connect to a lower face of the transistor separating region 13.

After that, the ion implantation mask 73 is removed by ashing processing or the like.

Subsequently, an ion implantation mask 54 made of, for example, a resist is formed on the upper face of the epitaxial layer 11 in a similar manner as described hereinabove with reference to FIG. 5. After that, using the ion implantation mask 54, ions of an n-type impurity are implanted into the epitaxial layer 11. Then, an n+ channel forming region 21 connecting to the bottom gate diffused layer 20 is formed in the epitaxial layer 11 in the n-channel junction type field effect transistor 5.

The following several steps of the manufacturing process are similar to those of the manufacturing process described hereinabove with reference to FIGS. 6 to 12, and accordingly, overlapping description thereof will be omitted to avoid redundancy. It is to be noted that, after removal of each ion implantation mask described hereinabove with reference to FIGS. 13 to 15, normally an impurity which has been used to implantation of ions is diffused and heat treatment is performed to eliminate possible crystal defects which may otherwise occur at any portion into which ions have been implanted.

According to the manufacturing process described above with reference to FIGS. 13 to 15, a bottom gate diffused layer 20 is formed by an ion implanting method after an epitaxial layer 11 is formed. Consequently, the thickness of the bottom gate diffused layer 20 is determined by heat treatment after ion implantation for the formation of the bottom gate diffused layer 20, and accordingly, the bottom gate diffused layer 20 is formed with a thickness of a designed value.

Having now fully described the invention, it will be apparent to one of ordinary skill in the art that many changes and modifications can be made thereto without departing from the spirit and scope of the invention as set forth herein.

What is claimed is:

1. A semiconductor device including a bipolar transistor and a junction type field effect transistor, comprising:
   a semiconductor substrate;
   an epitaxial layer formed on an upper face of said semiconductor substrate;
   a transistor separating region formed in said epitaxial layer except a formation region for said bipolar transistor and another formation region for said junction type field effect transistor;

a collector diffused layer formed in an upper face portion of said semiconductor substrate in said formation region for said bipolar transistor;

a base diffused layer formed in said epitaxial layer in said formation region for said bipolar transistor in such a manner as to connect to said collector diffused layer;

an emitter diffused layer formed at part of an upper face portion of said base diffused layer;

an element separating region formed in said epitaxial layer in said formation region for said bipolar transistor in such a manner as to neighbor with said base diffused layer;

a collector lead diffused layer formed in said epitaxial layer in said formation region for said bipolar transistor on the opposite side of said base diffused layer with respect to said element separating region in such a manner as to connect to said collector diffused layer;

a bottom gate diffused layer formed in an upper face portion of said semiconductor substrate in said formation region for said junction type field effect transistor;

a channel formation region formed in said epitaxial layer in said formation region for said junction type field effect transistor in such a manner as to connect to said bottom gate diffused layer;

a top gate diffused layer formed in said epitaxial layer in said formation region for said junction type field effect transistor in such a manner as to connect to said channel formation region; and a pair of source/drain diffused layers formed in said epitaxial layer on the opposite sides of said channel formation region in said formation region for said junction type field effect transistor.

2. A process of manufacturing a semiconductor device including a bipolar transistor and a junction type field effect transistor, comprising the steps of:

preparing a semiconductor substrate;

selectively implanting ions of an impurity into the semiconductor substrate to form a collector diffused layer in a formation region for the bipolar transistor;

selectively implanting ions of an impurity into the semiconductor substrate to form a bottom gate diffused layer in a formation region for the junction type field effect transistor;

forming an epitaxial layer on an entire upper face of the semiconductor substrate;

forming a pair of transistor separating regions and an element separating region in such a manner as to extend through the epitaxial layer to the semiconductor substrate and collector diffused layer, respectively;

selectively implanting ions of an impurity into the epitaxial layer in the formation region for the junction type field effect transistor to form a channel formation region in such a manner as to connect to the bottom gate diffused layer;

selectively implanting ions of an impurity into the epitaxial layer between one of the transistor separating regions and the element separating region and into the transistor separating regions in the formation region for the junction type field effect transistor to form a collector lead diffused layer and a pair of source/drain diffused layers, respectively;

selectively diffusing an impurity into the epitaxial layer above the channel formation region to form a top gate diffused layer;

selectively diffusing an impurity into a portion of the epitaxial layer above the collector diffused layer and selectively implanting ions of an impurity into the portion of the epitaxial layer to form a base diffused layer;

selectively diffusing an impurity into the base diffused layer to form an emitter diffused layer.

3. A process of manufacturing a semiconductor device including a bipolar transistor and a junction type field effect transistor, comprising the steps of:

preparing a semiconductor substrate;

selectively implanting ions of an impurity into the semiconductor substrate to form a collector diffused layer in a formation region for the bipolar transistor;

forming an epitaxial layer on an entire upper face of the semiconductor substrate;

forming a pair of transistor separating regions and an element separating region in such a manner as to extend through the epitaxial layer to the semiconductor substrate and collector diffused layer, respectively;

selectively implanting ions of an impurity into an upper face portion of the semiconductor substrate and a lower face portion of the epitaxial layer to form a bottom gate diffused layer in a formation region for the junction type field effect transistor;

selectively implanting ions of an impurity into the epitaxial layer in the formation region for the junction type field effect transistor to form a channel formation region in such a manner as to connect to the bottom gate diffused layer;

selectively implanting ions of an impurity into the epitaxial layer between one of the transistor separating regions and the element separating region and into the transistor separating regions in the formation region for the junction type field effect transistor to form a collector lead diffused layer and a pair of source/drain diffused layers, respectively;

selectively diffusing an impurity into the epitaxial layer above the channel formation region to form a top gate diffused layer;

selectively diffusing an impurity into a portion of the epitaxial layer above the collector diffused layer and selectively implanting ions of an impurity into the portion of the epitaxial layer to form a base diffused layer;

selectively diffusing an impurity into the base diffused layer to form an emitter diffused layer.

* * * * *